(12) United States Patent
Brox et al.

(10) Patent No.: US 8,055,857 B2
(45) Date of Patent: Nov. 8, 2011

(54) WRITE ACCESS AND SUBSEQUENT READ ACCESS TO A MEMORY DEVICE

(75) Inventors: Martin Brox, Munich (DE); Rex Kho, Holzkirchen (DE)

(73) Assignee: Qimonda AG, Munich (DE)

( * ) Notice: Subject to any disclaimer, the term of this patent is extended or adjusted under 35 U.S.C. 154(b) by 609 days.

(21) Appl. No.: 11/936,663

(22) Filed: Nov. 7, 2007

(65) Prior Publication Data
US 2008/0114947 A1    May 15, 2008

(30) Foreign Application Priority Data

Nov. 7, 2006  (DE) .................. 10 2006 052 338

(51) Int. Cl.
*G06F 13/36* (2006.01)
(52) U.S. Cl. .. 711/154; 711/163; 711/168; 711/E12.001

(58) Field of Classification Search .................. 711/154, 711/167
See application file for complete search history.

(56) References Cited

U.S. PATENT DOCUMENTS

| | | | |
|---|---|---|---|
| 6,351,427 B1 * | 2/2002 | Brown | 365/230.03 |
| 6,360,307 B1 | 3/2002 | Raftery et al. | |
| 2003/0145161 A1 | 7/2003 | Khandekar et al. | |

OTHER PUBLICATIONS

Infineon Technologies, 512-Mbit GDDR3 Graphics RAM, Data Sheet, Rev. 1.73, Aug. 2005, p. 51.

* cited by examiner

*Primary Examiner* — Kenneth Lo
(74) *Attorney, Agent, or Firm* — Patterson & Sheridan, LLP

(57) ABSTRACT

A memory device has a first memory area and a second memory area. A method for operating the memory device includes a write access to the first memory area and a read access to the second memory area.

19 Claims, 4 Drawing Sheets

FIG 3

WRITE ACCESS AND SUBSEQUENT READ ACCESS TO A MEMORY DEVICE

CROSS-REFERENCE TO RELATED APPLICATIONS

This application claims foreign priority benefits under 35 U.S.C. §119 to co-pending German patent application number DE 10 2006 052 338.5-55, filed 7 Nov. 2006. This related patent application is herein incorporated by reference in its entirety.

BACKGROUND OF THE INVENTION

Description of the Related Art

In memory devices such as DRAM (dynamic random access memory), for example, bidirectional line systems are provided for transferring data. These line systems, also referred to as data buses, are utilized both for a write access and for a read access. Therefore, storing write information to a memory cell array of a memory device and reading out read information from the memory cell array are substantially effected via the same transfer path. In this case, the provision of bidirectional data buses is a consequence of the miniaturization of components and electrical structures that is demanded in the semiconductor industry.

On account of this configuration, in the event of a read access to a memory device following a write access, a read command for initiating the read access is generally applied to the memory device only after a relatively long time duration after write information is buffered in the context of the write access, in order to avoid an internal collision of the write information to be written in and the read information to be read out on a bidirectional data bus. For illustration, FIG. 1 shows a signal-time diagram of a conventional DRAM memory device during a succession of a write access and a subsequent read access.

The signal-time diagram illustrates a differential clock signal CLK, CLK# applied to the memory device and comprising a periodic signal CLK (solid line) and a signal CLK# (dashed line) complementary thereto, and also commands CMD applied to the memory device. An evaluation of the applied commands CMD by a logic circuit of the memory device is carried out in each case time-synchronously with edges or crossing points of the clock signal CLK, CLK#.

The write access is initiated by a write command WRT applied to the memory device. This firstly initiates storage of write information fed to the memory device via external data lines in an input buffer of the memory device, said storage being effected on the basis of a further data clock signal DQS (data query strobe) applied to the memory device. In the present signal-time diagram, the write information has for example four write data W0, W1, W2 and W3, which are buffer-stored clock-synchronously with edges of the data clock signal DQS.

Figure 1:
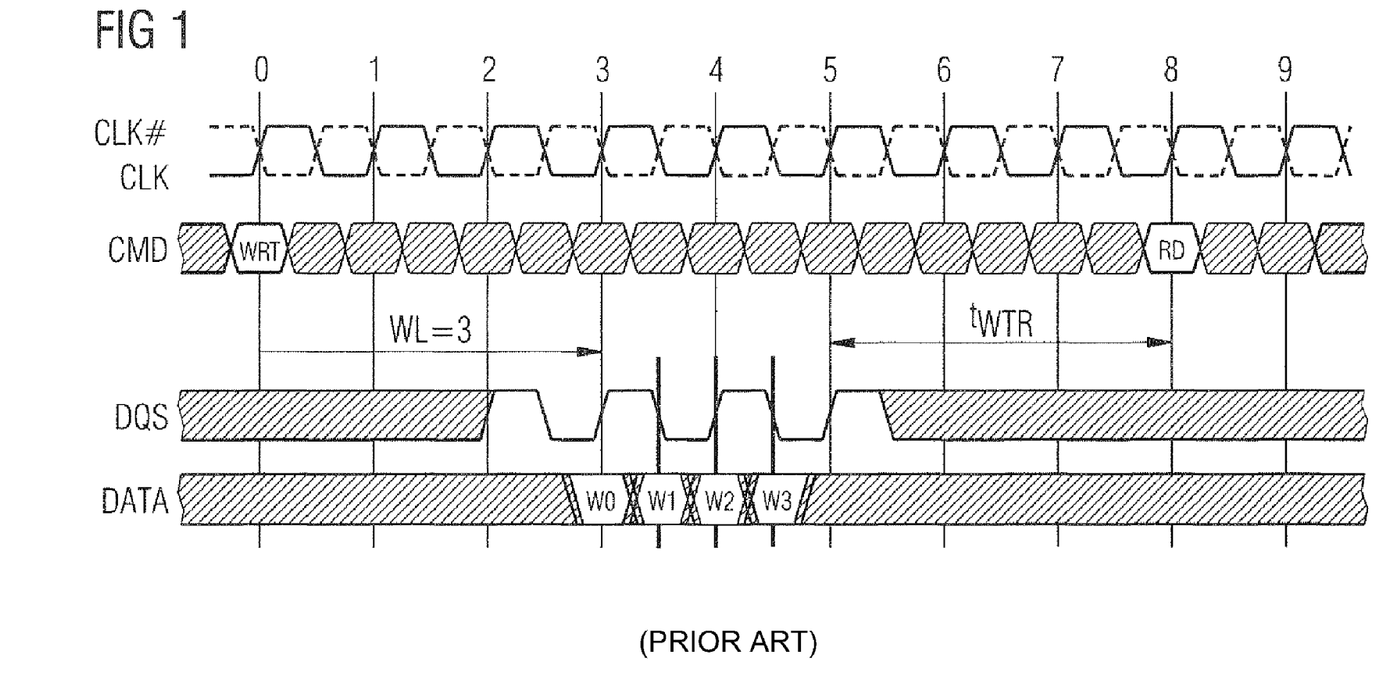
FIG. 1 shows a signal-time diagram of a conventional memory device during a succession of a write access and a subsequent read access.

As illustrated in FIG. 1, buffering of the first write datum W0 is usually carried out upon the first rising edge of the data clock signal DQS and is effected only after the elapsing of a latency WL (write latency), after the evaluation of the write command WRT, in order to internally prepare the write operation by the memory device. In this case, the latency WL amounts for example to three clock cycles of the clock signal CLK, CLK#. Buffering of the write information W0, W1, W2, W3 is followed by establishing a write connection between the input buffer and the memory cell array of the memory device by activating corresponding data buses for the write access, in order to transfer the write information W0, W1, W2, W3 to the memory cell array and write it to memory cells. The addressing operations carried out in this case are not discussed for reasons of clarity.

A read command RD for initiating a read access, in the course of which read information stored in the memory cell array is output from the memory cell array and then transferred to an output buffer of the memory device, is applied to the memory device, as described above, only after a relatively long time duration after buffer-storing the write information W0, W1, W2, W3, in order to avoid an internal data collision. Said time duration depends on a time constant $t_{WTR}$ (write to read command delay)—which is predefined for the memory device—between the last rising edge of the data clock signal DQS used for buffering the write information W0, W1, W2, W3 and the evaluation of the read command RD carried out upon an edge of the clock signal CLK, CLK#. The time constant $t_{WTR}$ amounts for example to three clock cycles of the clock signal CLK, CLK#, as is illustrated in the signal-time diagram of FIG. 1.

Furthermore, a read access takes up a relatively long time duration compared to a write access, which is a consequence, in particular, of amplifying operations carried out when outputting read information from the memory cell array and serving for amplifying read data stored in the memory cells. On account of the time constant $t_{WTR}$ and the long time duration for the read access, the succession of a write access and a subsequent read access may affect the performance of a memory device.

In order to avoid such losses of performance in a memory device, Sang-Bo L. et al., A 1.6 Gb/s/pin double-data-rate SDRAM with wave-pipelined CAS latency control, Samsung Electronics, Hwasung, Korea, 2004, IEEE International Solid-State Circuits Conference, Session 11, DRAM 11.6 0-7803-8267-6/04, propose a construction of a DRAM memory device in which, for each memory bank of the memory cell array, data buses for a write access are provided and data buses separate therefrom for a read access are provided. In this way, a succession of a write access to one bank and a read access to another bank may be carried out without a time constant $t_{WTR}$, which is referred to as "gapless write to read scheme". However, the provision of separate transfer paths for a write access and for a read access to the individual memory banks is associated with an enlarged (lateral) space requirement of the memory device.

BRIEF DESCRIPTION OF THE DRAWINGS

Various features of embodiments will become clear from the following description, taking in conjunction with the accompanying drawings. It is to be noted, however, that the accompanying drawings illustrate only typical embodiments and are, therefore, not to be considered limiting of the scope of the invention. The present invention may admit other equally effective embodiments.

DETAILED DESCRIPTION OF THE PREFERRED EMBODIMENT

The embodiments described in the following relate to a method for operating a memory device, wherein a write access for storing write information to the memory device and subsequently a read access for reading out read information from the memory device are carried out. The embodiments furthermore relate to a memory device in which such a method is carried out.

One embodiment relates to a method for operating a memory device, wherein the memory device has a first memory area and a second memory area, and wherein a write access to the first memory area and a read access to the second memory area are carried out. This method comprises applying a write command to the memory device for a write access to the first memory area and subsequently storing write information in an input buffer of the memory device. This is followed by establishing a write connection between the input buffer and the first memory area for transferring the write information from the input buffer to the first memory area and applying a read command to the memory device for a read access to the second memory area. The write connection is disconnected after a first period of time after applying the read command. After a second period of time after applying the read command, a read connection is established between the second memory area and an output buffer of the memory device for transferring read information outputted from the second memory area to the output buffer.

The method utilizes the fact that an outputting of read information from a memory area of the memory device that has memory cells, the outputting of data being initiated on the basis of an applied read command, may take up a relatively long time duration, in particular on account of amplifying operations carried out and serving for amplifying the read information. Said time duration may exceed the time duration for transferring and writing the write information to a memory area of the memory device.

For this reason, during a succession of a write access to the first memory area and a subsequent read access to the second memory area, a read command for initiating the read access may be applied to the memory device relatively early, for example already during establishing the write connection between the input buffer and the first memory area. Since a transfer of the write information from the input buffer to the first memory area may be completed before a start of a transfer of the read information outputted from the second memory area to the output buffer, a data collision between the write information and the read information may be avoided.

The write access to the first memory area and the read access to the second memory area may therefore substantially be realized via the same transfer path, which results in a small space requirement. Furthermore, by disconnecting the write connection after the first period of time after applying the read command and establishing the read connection after the second period of time after applying the read command, the read information may be reliably transferred to the output buffer.

In accordance with a further embodiment, the write information may be transferred from the input buffer to the first memory area before an end of the first period of time, in order not to impair the memory property of the memory device.

In accordance with a further embodiment, at least one part of the write connection and at least one part of the read connection may be effected via a common transfer path assigned to the first memory area and to the second memory area.

In accordance with a further embodiment, the write connection may additionally be effected via a first transfer path, which is assigned only to the first memory area, and the read connection may additionally be effected via a second transfer path, which is assigned only to the second memory area. In this case, the first transfer path and the second transfer path may be coupled to the common transfer path.

In accordance with a further embodiment, a high reliability of the method may be obtained by generating a preindication signal for indicating an imminent start of a transfer of the read information outputted from the second memory area via the second transfer path. The write connection between the input buffer and the first memory area may be disconnected on the basis of the preindication signal.

In accordance with a further embodiment, the second transfer path, which is assigned only to the second memory area, may be activated for the read access after disconnecting the write connection, and an indication signal may be generated for indicating a start of a transfer of the read information outputted from the second memory area via the second transfer path. The common transfer path may be activated for the read access on the basis of the indication signal in order to transfer the read information to the output buffer. A high reliability of the method my be obtained in this way, too. Since in this embodiment the second transfer path is activated for the read access only after disconnecting the write connection, it is prevented that read information outputted from the second memory area is written to the first memory area via the second transfer path, the common transfer path and the first transfer path.

In accordance with a further embodiment, generating the preindication signal and/or generating the indication signal may be carried out on the basis of a simulation of a time duration for outputting the read information from the second memory area. In this way, generating the preindication signal and/or generating the indication signal may be coordinated, with a high accuracy, with the actual outputting of the read information from the second memory area.

Another embodiment relates to a memory device, having a first memory area, a second memory area, an input buffer, an output buffer and a control device. The control device establishes a write connection between the input buffer and the first memory area in order to transfer write information stored in the input buffer from the input buffer to the first memory area. At this, the write connection is established on the basis of a write command applied to the memory device for a write access to the first memory area. The control device further disconnects the write connection after a first period of time after applying a read command to the memory device for a read access to the second memory area, the read command being applied subsequently to applying the write command. The control device furthermore establishes a read connection between the second memory area and the output buffer after a second period of time after applying the read command in order to transfer read information outputted from the second memory area to the output buffer.

In a corresponding manner, the memory device utilizes that the time duration for outputting read information from a memory area may exceed a time duration for transferring and writing write information to a memory area. Consequently, in the event of a read access to the second memory area following a write access to the first memory area, the associated read command may already be applied to the memory device during establishing the write connection or during transferring the write information from the input buffer to the first memory area, respectively. Since the transfer of the write information may be completed before a start of the transfer of the read information, the provision of completely separate transfer paths or data buses in the memory device for the write access and the read access may be avoided.

In accordance with a further embodiment, the memory device may have a simulation device which simulates a time duration for outputting the read information from the second memory area. The simulation device may further generate the above-described preindication signal and/or the indication signal. In this case, the simulation device may be provided with a relatively small space requirement in the memory device. Said space requirement may in particular be negligible compared to a space requirement for providing completely separate transfer paths for a write access and a read access.

Further embodiments relating to a sequence of a write access and a subsequent read access to a memory device are explained in conjunction with the drawings.

Figure 2:
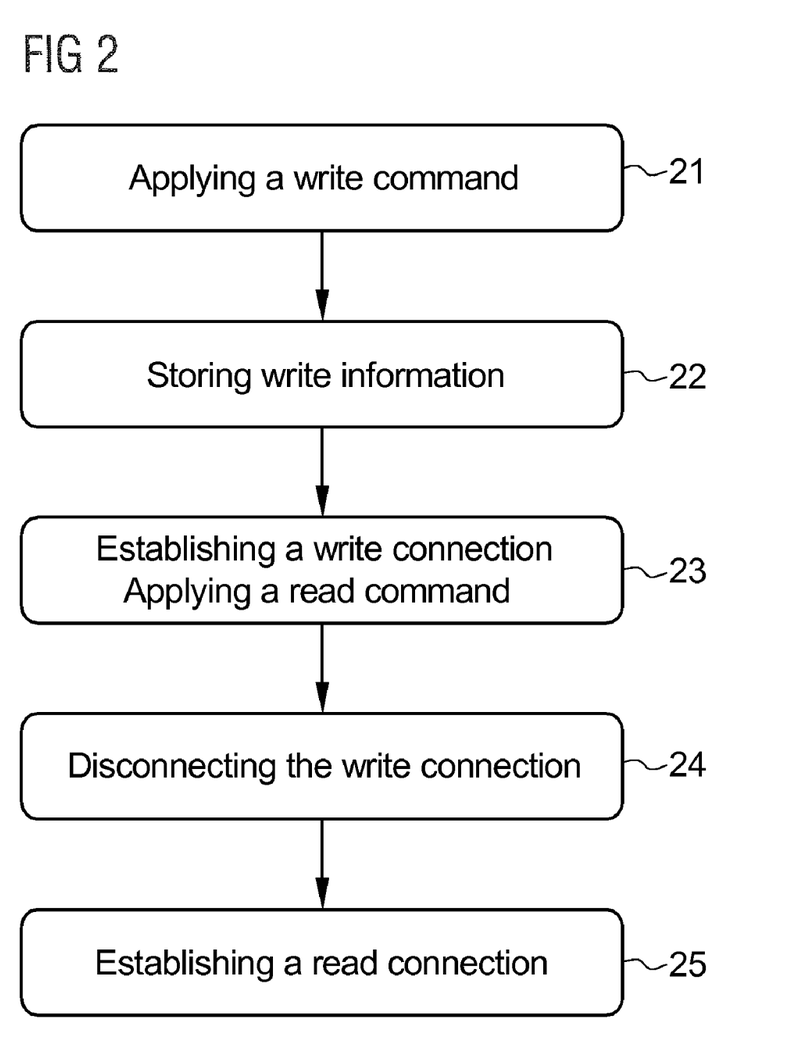
FIG. 2 shows a flowchart of a method for operating a memory device.

FIG. 2 shows a flowchart of a method for operating a memory device in accordance with one embodiment. The memory device, which is a DRAM memory device, for example, has a first memory area and a second memory area comprising memory cells for storing information. A write access to the first memory area and a read access to the second memory area of the memory device are carried out in the course of the method.

For the write access to the first memory area, a first method step 21 includes applying a corresponding write command to the memory device. On the basis of the applied write command, in a further method step 22, write information fed to the memory device from an external device is initially stored in an input buffer of the memory device. A subsequent method step 23 comprises establishing a write connection between the input buffer and the first memory area in order to transfer the write information from the input buffer to the first memory area and to store it in the first memory area. Moreover, during establishing the write connection or during transferring the write information from the input buffer to the first memory area, respectively, a read command is applied to the memory device for a read access to the second memory area.

The method utilizes the fact that an outputting—initially initiated on the basis of the applied read command—of read information from the second memory area takes up a relatively long time duration in particular on account of amplifying operations carried out in this case and serving for amplifying the read information, before the read information is available for a transfer—to be carried out after outputting from the second memory area—to an output buffer of the memory device. Said time duration exceeds the time duration for transferring and writing the write information to the first memory area of the memory device.

For this reason, during the succession of the write access to the first memory area and the read access to the second memory area, the read command for initiating the read access may be applied to the memory device relatively early, that is to say actually during establishing the write connection between the input buffer and the first memory area. Since the transfer of the write information from the input buffer to the first memory area has already ended before a start—following the outputting of the read information from the second memory area—of a transfer of the read information to the output buffer, there is no risk of a data collision between the write information and the read information. The write access to the first memory area and the read access to the second memory area may therefore substantially be realized via the same transfer path, thus resulting in a space-saving embodiment for a fast succession of a write access and a read access to the memory device.

A further method step 24 comprises disconnecting the write connection between the input buffer and the first memory area after a first period of time after applying the read command to the memory device. In this case, the transfer of the write information from the input buffer to the first memory area is completed in particular before an end of the first period of time, in order not to impair the memory property of the memory device.

A subsequent method step 25 comprises establishing a read connection between the second memory area and the output buffer of the memory device after a second period of time after applying the read command to the memory device. In this way, the read information outputted from the second memory area is transferred to the output buffer and stored in the output buffer. Proceeding from the output buffer, the read information may subsequently be transferred to devices outside the memory device.

The method illustrated in FIG. 2 may be used in an analogous manner for a succession of a write access to the second memory area and a read access to the first memory area.

On account of disconnecting the write connection after the first period of time after applying the read command and establishing the read connection after the second period of time after applying the read command, impairment of the read connection on account of a write connection which is (still) active and thus counteracts the read connection may be avoided. Consequently, the outputted read information may be reliably transferred to the output buffer of the memory device.

One exemplary embodiment is explained with reference to the subsequent FIGS. 3 and 4. In this case, FIG. 3 shows a schematic illustration of a memory device 30, and FIG. 4 shows a signal-time diagram of the commands and signals during a succession of a write access and a read access to the memory device 30.

Figure 3:
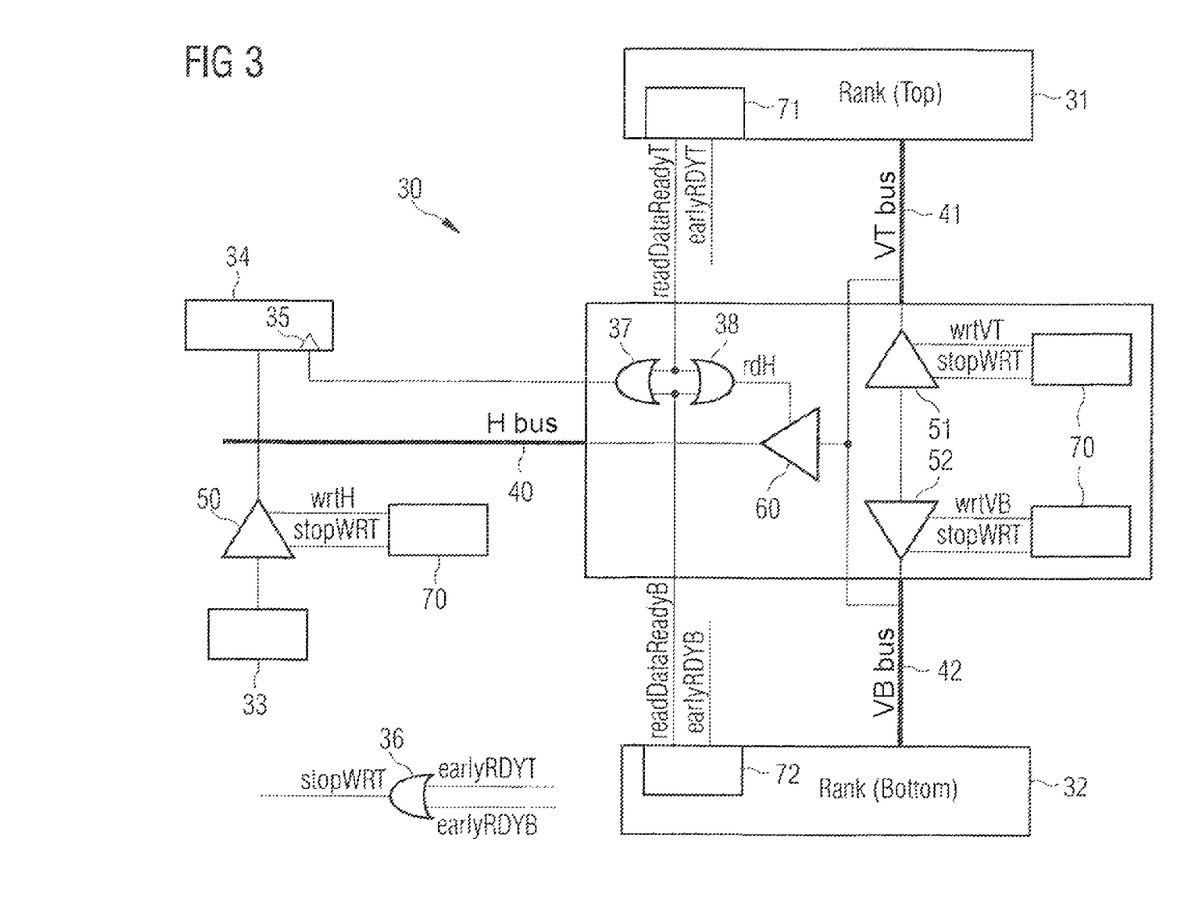
FIG. 3 shows a schematic illustration of a memory device.
Figure 4:
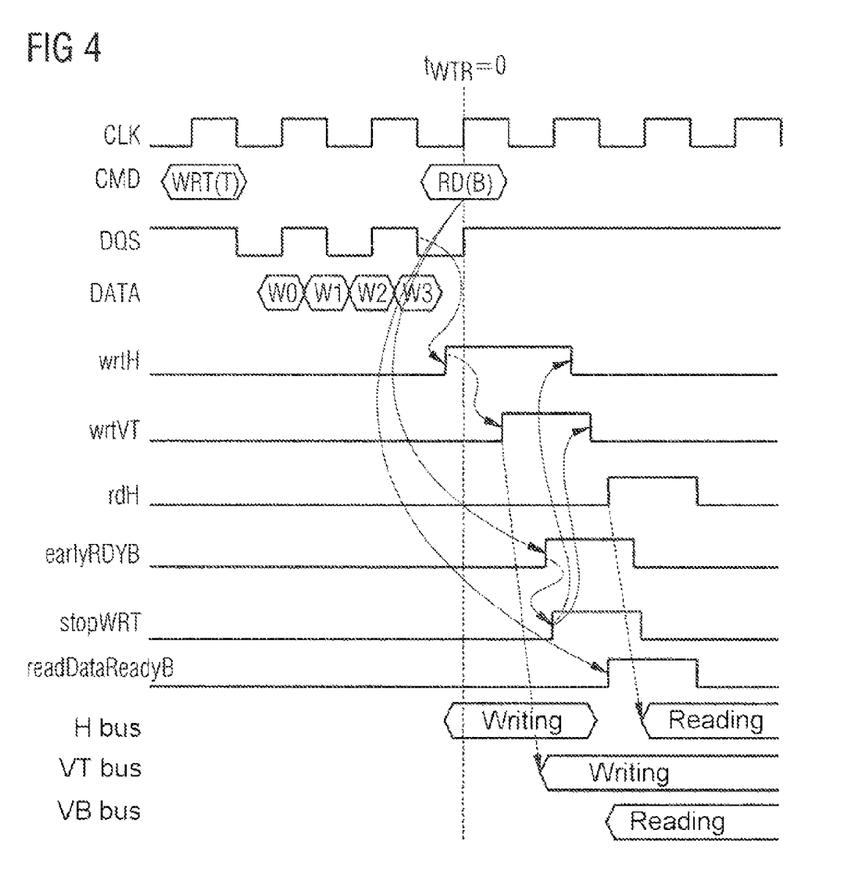
FIG. 4 shows a signal-time diagram of a succession of a write access and a subsequent read access to the memory device illustrated in FIG. 3.

The memory device 30 illustrated in FIG. 3, said memory device being embodied as a DRAM memory device, for example, has an input buffer 33, an output buffer 34 and a memory cell array for storing information, wherein the memory cell array comprises two logic memory areas 31, 32 (Rank(Top), Rank(Bottom)). The two memory areas 31, 32 are referred to hereinafter as first memory area 31 and second memory area 32.

The memory device 30 furthermore has a common data bus 40 assigned to the two memory areas 31, 32, a data bus 41 assigned only to the first memory area 31, and a data bus 42 assigned only to the second memory area 32, via which it is possible to establish write connections between the input buffer 33 and the memory areas 31, 32 and also read connections between the memory areas 31, 32 and the output buffer 34. The data buses 40, 41, 42 are also referred to hereinafter, in accordance with FIG. 3, as H bus 40 (horizontal), VT bus 41 (vertical top) and VB bus 42 (vertical bottom). In this case, the VT bus 41 and the VB bus 42 are coupled to the H bus 40 for a data transfer (not illustrated in FIG. 3).

All three data buses 40, 41, 42 are formed in bidirectional fashion, i.e. suitable both for transferring write information in the context of a write access and for transferring read information in the context of a read access. For transferring information, the individual data buses 40, 41, 42 are activated with the aid of drivers assigned to the data buses 40, 41, 42 for corresponding access. For activating the H bus 40 for a write access, a driver 50 is formed in the memory device 30. Drivers 51, 52 are provided for activating the VT bus 41 and the VB bus 42 for a write access. The drivers 50, 51, 52 are in each case connected to a control device 70 of the memory device 30. Furthermore, the memory device 30 has further drivers which are assigned to the individual data buses 40, 41, 42 and connected to the control device 70 and serve for activating the data buses 40, 41, 42 for a read access. In this case, FIG. 3 illustrates only one driver 60 assigned to the H bus 40.

In order to initiate a write access to the first memory area 31, as illustrated in FIG. 4, a write command WRT(T) (write top) is applied to the memory device 30 or the control device 70, respectively. An evaluation of the write command WRT(T) by the control device 70 takes place upon a rising edge of a clock signal CLK applied to the memory device 30. This initially initiates storage of write information fed to the memory device 30 externally in the input buffer 33, said storage being carried out on the basis of a further data clock signal DQS applied to the memory device 30.

As illustrated in FIG. 4, the write information has for example four write data W0, W1, W2 and W3, which are stored in the input buffer 33 clock-synchronously with edges of the data clock signal DQS. In this case, the first write date W0 is buffer-stored with the first rising edge of the data clock signal DQS. The further write data W1, W2 and W3 are buffer-stored upon further edges of the data clock signal DQS following the first rising edge. As an alternative, the write information may also have a different number of write data.

Subsequently to buffering the last write datum W3 upon the last falling edge of the data clock signal DQS, a write connection is established between the input buffer 33 and the first memory area 31. For this purpose, the control device 70 generates an activation signal wrtH (write horizontal), which is fed to the driver 50 for activating the H bus 40 for the write access. The VT bus 41 is activated for the write access via a further activation signal wrtVT (write vertical top), which is generated by the control device 70 and applied to the driver 51. Via the activated H bus 40 and the activated VT bus 41, the write data W0, W1, W2, W3 are transferred from the input buffer 33 to the first memory area 31 in order to write the write data W0, W1, W2, W3 to the first memory area 31.

During establishing the write connection or during transferring the write data W0, W1, W2, W3 from the input buffer 33 to the first memory area 31, a read command RD(B) (read bottom) for initiating a read access to the second memory area 32 is applied to the memory device 30. As illustrated in FIG. 4, an evaluation of the read command RD(B) by the control device 70 takes place upon an edge of the clock signal CLK which follows the sequence of edges of the data clock signal DQS during which the write data W0, W1, W2, W3 are buffer-stored. Consequently, no time delay or time constant $t_{WTR}$ is provided in the signal-time diagram of FIG. 4 ($t_{WTR}=0$).

On the basis of the read command RD(B), firstly the outputting of read information from the second memory area 32 is initiated by means of the control device 70. Outputting the read information comprises, in particular, amplifying the read data stored in memory cells of the second memory area 32. The time duration required for outputting the read information from the second memory area 32 exceeds the time duration in which the write data W0, W1, W2, W3 are transferred from the input buffer 33 to the first memory area 31. The read information also comprises, in a manner corresponding to the write information, for example four or alternatively a different number of read data (not illustrated).

The time duration required for outputting the read information from the second memory area 32 is simulated by means of a simulation device 72 (see FIG. 3) assigned to the second memory area 32. In the context of simulating said time duration, the simulation device 72 generates a preindication signal earlyRDYB (early ready bottom) for indicating an imminent end of the outputting of the read information and thus an imminent start of a transfer of the read information outputted from the second memory area 32 via the VB bus 42.

On the basis of the preindication signal earlyRDYB, the write connection—established via the H bus 40 and the VT bus 41—between the input buffer 33 and the first memory area 31 is disconnected. For this purpose, the preindication signal earlyRDYB is fed to a logic OR gate 36 of the control device 70 for generating a deactivation signal stopWRT (stop write), with the aid of which the drivers 50, 51 and thus the H bus 40 activated for the write access and the VT bus 41 activated for the write access are deactivated (see FIGS. 3 and 4).

After disconnecting the write connection, the VB bus 42 is activated for the read access with the aid of a corresponding driver (not illustrated in FIG. 3) assigned to the VB bus 42. Furthermore, the simulation device 72 generates, in the context of simulating the time duration for outputting the read information, an indication signal readDataReadyB (read data ready bottom) for indicating the start of the transfer of the read information outputted from the second memory area 32 via the VB bus 42.

On the basis of the indication signal readDataReadyB, the (deactivated) H bus 40 is activated for the read access. For this purpose, the indication signal readDataReadyB is communicated to a logic OR gate 38 of the control device 70 for generating an activation signal rdH (read horizontal). In this case, the activation signal rdH is fed to the driver 60 for activating the H bus 40 for the read access (see FIGS. 3 and 4).

Via the activated H bus 40 and the activated VB bus 42, the read information outputted from the second memory area 32 is transferred to the output buffer 34. The transfer of the read information to the output buffer 34 is indicated to the output buffer 34, as illustrated in FIG. 3, via a further logic OR gate 37, which is connected to a counter input 35 of the output buffer 34 and to which the indication signal readDataReadyB is likewise fed.

For better illustration of the above-described succession of the write access to the first memory area 31 and the read access to the second memory area 32, the last three lines of the signal-time diagram of FIG. 4 additionally illustrate in each case present states (writing/reading) of the individual data buses 40, 41, 42.

The method explained with reference to FIGS. 3 and 4 may be carried out in an analogous manner during a succession of a write access to the second memory area 32 and a read access to the first memory area 31. The logic OR gates 36, 37, 38 are provided in the memory device 30 for this purpose. The VB bus 42, as illustrated in FIG. 3, may correspondingly be activated for the write access with the aid of an activation signal wrtVB (write vertical bottom) fed to the associated driver 52. Provision is also made of a simulation device 71 for simulating a time duration for outputting read information from the first memory area 31 and for generating a preindication signal earlyRDYT (early ready top) and an indication signal readDataReadyT (read data ready top) for indicating an (imminent) start of a transfer of read information via the VT bus 41 activated for the read access.

The two simulation devices 71, 72 may have circuit structures for accurately simulating the time duration for outputting read information from a memory area 31, 32, in order to coordinate generating a preindication signal and/or an indication signal, with a high accuracy, with the actual outputting of read information from a memory area. In this case, the provision of the simulation devices 71, 72 may require only a small space requirement in the memory device 30. Said space requirement may be negligible, in particular, by comparison with a space requirement for providing completely separate transfer paths for a write access and a read access. Instead of providing two simulation devices 71, 72 assigned to the individual memory areas 31, 32, in an alternative embodiment it is possible to provide just one simulation device assigned to both memory areas 31, 32.

The method explained with reference to FIGS. 3 and 4 and the memory device 30 illustrated represent one exemplary embodiment. Instead of the embodiment described, further modifications are conceivable which enable a fast succession of a write access to a first memory area and a read access to a second memory area of a memory device by utilizing the time duration for outputting information from the second memory area.

The preceding description describes exemplary embodiments of the invention. The features disclosed therein and the claims and the drawings can, therefore, be useful for realizing the invention in its various embodiments, both individually and in any combination. While the foregoing is directed to embodiments of the invention, other and further embodiments of this invention may be devised without departing from the basic scope of the invention, the scope of the present invention being determined by the claims that follow.

What is claimed is:

1. A method for operating a memory device, wherein the memory device has a first memory area and a second memory area, the method comprising:
    applying a write command to the memory device for a write access to the first memory area;
    storing write information in an input buffer of the memory device;
    establishing a write connection between the input buffer and the first memory area for transferring the write information from the input buffer to the first memory area;
    applying a read command to the memory device for a read access to the second memory area;
    disconnecting the write connection after a first period of time after applying the read command; and
    establishing a read connection between the second memory area and an output buffer of the memory device for transferring read information from the second memory area to the output buffer, the read connection being established after a second period of time after applying the read command and subsequent to disconnecting the write connection, wherein the read connection is maintained while all read information, for the read command, is outputted from the second memory area to the output buffer.

2. The method according to claim 1, wherein the write information is transferred from the input buffer to the first memory area before an end of the first period of time.

3. The method according to claim 1, wherein at least one part of the write connection and at least one part of the read connection are effected via a common transfer path assigned to the first memory area and to the second memory area.

4. The method according to claim 3, wherein the write connection is additionally effected via a first transfer path that is assigned only to the first memory area, wherein the read connection is additionally effected via a second transfer path that is assigned only to the second memory area, and wherein the first transfer path and the second transfer path are coupled to the common transfer path.

5. The method according to claim 4, further comprising, for establishing the write connection:
    activating the common transfer path for the write access; and
    activating the first transfer path for the write access.

6. The method according to claim 5, further comprising, for disconnecting the write connection:
    deactivating the common transfer path activated for the write access; and
    deactivating the first transfer path activated for the write access.

7. The method according to claim 4, further comprising:
    generating a preindication signal for indicating an imminent start of a transfer of the read information outputted from the second memory area via the second transfer path; and
    disconnecting the write connection on the basis of the preindication signal.

8. The method according to claim 7, wherein generating the preindication signal is carried out on the basis of a simulation of a time duration for outputting the read information from the second memory area.

9. The method according to claim 4, further comprising:
    activating the second transfer path for the read access after disconnecting the write connection;
    generating an indication signal for indicating a start of a transfer of the read information outputted from the second memory area via the second transfer path; and
    activating the common transfer path for the read access on the basis of the indication signal in order to transfer the read information to the output buffer.

10. The method according to claim 9, wherein generating the indication signal is carried out on the basis of a simulation of a time duration for outputting the read information from the second memory area.

11. The method according to claim 1, wherein storing the write information in the input buffer of the memory device is carried out synchronously with edges of a sequence of edges of a periodic data clock signal, and wherein an evaluation of the read command is carried out synchronously with an edge of a periodic clock signal that follows the sequence of edges of the periodic data clock signal.

12. A method for operating a memory device, wherein the memory device has a first memory area and a second memory area, and wherein a write access to the first memory area and subsequently a read access to the second memory area are carried out, the method comprising:
    applying a write command to the memory device for a write access to the first memory area;
    storing write information in an input buffer of the memory device;
    establishing a write connection between the input buffer and the first memory area for transferring the write information from the input buffer to the first memory area;
    applying a read command to the memory device for a read access to the second memory area during establishing the write connection or during transferring the write information from the input buffer to the first memory area;
    disconnecting the write connection after a first period of time after applying the read command; and
    establishing a read connection between the second memory area and an output buffer of the memory device for transferring read information from the second memory area to the output buffer, the read connection being established after a second period of time after applying the read command and subsequent to disconnecting the write connection, wherein the read connection is maintained while all read information, for the read command, is outputted from the second memory area to the output buffer, wherein at least one part of the write connection and at least one part of the read connection are effected via a common transfer path assigned to the first memory area and to the second memory area.

13. A memory device comprising:
a first memory area;
a second memory area;
an input buffer;
an output buffer; and
a control device,
wherein the control device
establishes a write connection between the input buffer and the first memory area in order to transfer write information stored in the input buffer from the input buffer to the first memory area, the write connection being established on the basis of a write command applied to the memory device for a write access to the first memory area;
disconnects the write connection after a first period of time after applying a read command to the memory device for a read access to the second memory area, the read command being applied subsequently to applying the write command; and
establishes a read connection between the second memory area and the output buffer in order to transfer read information from the second memory area to the output buffer, the read connection being established after a second period of time after applying the read command and subsequent to disconnecting the write connection, wherein the read connection is established while read information is outputted from the second memory area to the output buffer.

14. The memory device according to claim 13, further comprising a common data bus assigned to the first memory area and to the second memory area for the write connection and for the read connection.

15. The memory device according to claim 14, further comprising a first data bus that is assigned only to the first memory area and a second data bus that is assigned only to the second memory area, wherein the first data bus and the second data bus are coupled to the common data bus.

16. The memory device according to claim 13, further comprising a simulation device that simulates a time duration for outputting the read information from the second memory area.

17. The memory device according to claim 15, wherein the memory device further comprises a simulation device that generates a preindication signal for indicating an imminent start of a transfer of the read information outputted from the second memory area via the second data bus, and wherein the control device disconnects the write connection on the basis of the preindication signal generated by the simulation device.

18. The memory device according to claim 15, wherein the memory device further comprises a simulation device that generates an indication signal for indicating a start of a transfer of the read information outputted from the second memory area via the second data bus, and wherein the control device activates the common data bus for the read access on the basis of the indication signal generated by the simulation device in order to transfer the read information to the output buffer.

19. A memory device comprising:
a first memory area;
a second memory area;
an input buffer;
an output buffer;
a common data bus assigned to the first memory area and to the second memory area; and
a control device,
wherein the control device
establishes a write connection between the input buffer and the first memory area in order to transfer write information stored in the input buffer from the input buffer to the first memory area, the write connection being established on the basis of a write command applied to the memory device for a write access to the first memory area, wherein at least one part of the write connection is effected via the common data bus;
disconnects the write connection after a first period of time after applying a read command to the memory device for a read access to the second memory area, the read command being applied subsequently to applying the write command and being applied during establishing the write connection or during transferring the write information from the input buffer to the first memory area; and
establishes a read connection between the second memory area and the output buffer in order to transfer read information outputted from the second memory area to the output buffer, wherein at least one part of the read connection is effected via the common data bus, and wherein the read connection is established after a second period of time after applying the read command and subsequent to disconnecting the write connection, wherein the read connection is maintained while all read information, for the read command, is outputted from the second memory area to the output buffer.

* * * * *